(12) United States Patent
Sanada et al.

(10) Patent No.: US 9,795,053 B2
(45) Date of Patent: Oct. 17, 2017

(54) ELECTRONIC DEVICE AND METHOD FOR MANUFACTURING THE ELECTRONIC DEVICE

(71) Applicant: DENSO CORPORATION, Kariya, Aichi-pref. (JP)

(72) Inventors: Yuki Sanada, Kariya (JP); Atsushi Kashiwazaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 15 days.

(21) Appl. No.: 14/392,135

(22) PCT Filed: Jun. 17, 2014

(86) PCT No.: PCT/JP2014/003220
§ 371 (c)(1),
(2) Date: Dec. 23, 2015

(87) PCT Pub. No.: WO2014/208044
PCT Pub. Date: Dec. 31, 2014

(65) Prior Publication Data
US 2016/0183405 A1    Jun. 23, 2016

(30) Foreign Application Priority Data

Jun. 28, 2013   (JP) ................................. 2013-136894

(51) Int. Cl.
*H05K 1/18*     (2006.01)
*H05K 7/20*     (2006.01)
(Continued)

(52) U.S. Cl.
CPC ... *H05K 7/20127* (2013.01); *B29C 45/14655* (2013.01); *H01L 23/13* (2013.01);
(Continued)

(58) Field of Classification Search
CPC ..... H01L 23/2321; H01L 23/42; H01L 23/13; H05K 1/181
See application file for complete search history.

(56) References Cited

U.S. PATENT DOCUMENTS 6,153,939 A * 11/2000 Wang .................... H01L 21/563
257/734
6,228,688 B1    5/2001 Ohta et al.
(Continued)

FOREIGN PATENT DOCUMENTS

JP    1995-226414 A    8/1995
JP       07226414 A *  8/1995

OTHER PUBLICATIONS

International Search Report of the International Searching Authority dated Sep. 22, 2014 issued in the corresponding International application No. PCT/JP2014/003220 (and English translation).
(Continued)

*Primary Examiner* — Hoa C Nguyen
*Assistant Examiner* — Christopher L Augustin
(74) *Attorney, Agent, or Firm* — Posz Law Group, PLC (57) ABSTRACT

An air vent is formed in a substrate of an electronic device such that air in a cavity of a metal mold can be released through the air vent when a resin is molded. Solder resist is disposed on a second surface of the substrate and has an opening portion at a position corresponding to the air vent. As such, the air can be also released from a clearance between a lower mold and the solder resist resulting from a rough surface of the solder resist. The resin can be held in a space provided between the second surface of the substrate and the lower mold. Therefore, the resin having passed through the air vent can be restricted from flowing out, and
(Continued)

the air vent can be restricted from losing its function due to the substrate and the metal mold closely contacting with each other.

5 Claims, 6 Drawing Sheets (51) Int. Cl.
H01L 23/31 (2006.01)
H01L 23/13 (2006.01)
H01L 23/32 (2006.01)
H01L 23/42 (2006.01)
H01L 23/433 (2006.01)
B29C 45/14 (2006.01)
H01L 21/56 (2006.01)
B29C 45/34 (2006.01)
H01L 25/16 (2006.01)

(52) U.S. Cl.
CPC .......... H01L 23/3121 (2013.01); H01L 23/32 (2013.01); H01L 23/42 (2013.01); H01L 23/433 (2013.01); H05K 1/181 (2013.01); B29C 45/34 (2013.01); H01L 21/565 (2013.01); H01L 25/16 (2013.01); H01L 2224/48091 (2013.01); H01L 2224/73265 (2013.01); H01L 2924/13055 (2013.01); H01L 2924/19105 (2013.01)

(56) References Cited

U.S. PATENT DOCUMENTS

| | | | |
|---|---|---|---|
| 6,324,069 B1* | 11/2001 | Weber | H01L 21/563 174/260 |
| 6,596,561 B2* | 7/2003 | Takahashi | H01L 21/561 257/E21.504 |
| 7,382,060 B2* | 6/2008 | Farnworth | H01L 21/3043 257/690 |
| 2002/0074650 A1 | 6/2002 | Takahashi et al. | |
| 2002/0167093 A1* | 11/2002 | Koike | H01L 21/563 257/778 |
| 2003/0042035 A1* | 3/2003 | Myers | H01L 21/563 174/558 |
| 2003/0145461 A1 | 8/2003 | Kasai et al. | |
| 2003/0205797 A1 | 11/2003 | Takahashi et al. | |
| 2004/0164428 A1 | 8/2004 | Takahashi et al. | |
| 2005/0127535 A1 | 6/2005 | Takahashi et al. | |
| 2006/0103021 A1* | 5/2006 | Liu | H01L 23/3128 257/738 |
| 2006/0231936 A1* | 10/2006 | Matsuda | H01L 24/49 257/678 |
| 2007/0045870 A1* | 3/2007 | Kuramochi | H01L 21/563 257/782 |
| 2008/0307642 A1* | 12/2008 | Kurashima | H01L 21/565 29/832 |
| 2009/0229513 A1* | 9/2009 | Hisada | H01L 21/563 118/50 |
| 2014/0054792 A1* | 2/2014 | Yang | H01L 23/49827 257/774 |

OTHER PUBLICATIONS

Written Opinion of the International Searching Authority dated Sep. 22, 2014 issued in the corresponding International application No. PCT/JP2014/003220 (and English translation).

* cited by examiner

ELECTRONIC DEVICE AND METHOD FOR MANUFACTURING THE ELECTRONIC DEVICE

CROSS REFERENCE TO RELATED APPLICATIONS

This application is a U.S. national stage of International Application No. PCT/JP2014/003220 filed on Jun. 17, 2014 and is based on Japanese Patent Application No. 2013-136894 filed on Jun. 28, 2013, the disclosures of which are incorporated herein by reference.

TECHNICAL FIELD

The present disclosure relates to an electronic device and a method for manufacturing the same in which an electronic component is mounted on a surface of a substrate and the surface of the substrate is sealed with a molding resin.

BACKGROUND ART

An electronic device having an electronic component on a surface of a substrate has been proposed. The electronic device has a surface pattern that is electrically connected to a land and an external circuit on the surface of the substrate. Also, the electronic device has a solder resist that covers the surface pattern. The solder resist has an opening that exposes a portion of the substrate pattern connected to the external circuit. The electronic component is mounted on the land of the surface of the substrate through solder or the like. The surface of the substrate having the electronic component thereon is sealed with a molding resin in a state where at least the portion of the substrate pattern connected to the external circuit is exposed from the molding resin.

The electronic device described above is manufactured by the following method. Specifically, the land and the surface pattern are firstly formed on the surface of the substrate. After the surface pattern is covered with the solder resist, the opening is formed in the solder resist to expose a part of the surface pattern. Next, the electronic component is mounted on the land through the solder or the like. Then, a metal mold that has a recessed portion on a surface is prepared and the surface of the metal mold is pressure-welded to the surface of the substrate in a state where the electronic component is arranged in the recessed portion. Thereafter, the molding resin is inserted into a space between the substrate and the recessed portion of the metal mold. As such, a one-side-mounted electronic device (half-mold-type electronic device), in which the surface of the substrate having the electronic component is sealed with the molding resin, can be manufactured.

In the manufacturing of the electronic device, however, there is a case where air bubbles remain in the metal mold when the molding resin is inserted and the air bubbles are formed in the molding resin. In patent literature 1, a through hole is formed in the substrate to provide an air vent (air releasing portion). Since air can be released through the air vent when the molding resin is inserted, the air bubbles can be restricted from remaining in the metal mold.

PRIOR ART LITERATURE

Patent Literature

Patent literature 1: JP H10-275818 A

SUMMARY OF INVENTION

In a case where the through hole is merely formed in the substrate and used as the air vent as described in patent literature 1, since there is no portion to receive the molding resin flowing out through the through hole, the molding resin cannot be stopped. Therefore, the molding resin will flow to an unexpected portion. In a case where a core member of the metal mold, which does not have a cavity, that is, a member pressing the substrate, closely contacts the substrate to closely contact with an opening end of the through hole, since there is no portion to receive the molding resin, the through hole will not function as the air vent.

The present disclosure is made in view of the forgoing issues, and it is an object of the present disclosure to provide an electronic device having a substrate formed with an air vent and a method for manufacturing the same, which is capable of restricting a molding resin having passed through the air vent from flowing out, and restricting the air vent from losing its function due to the substrate and a molding closely contacting with each other.

According to an aspect of the present disclosure, an electronic device includes: a substrate that has a first surface and a second surface opposite to the first surface; an electronic component that is mounted on the first surface of the substrate; and a molding resin that is disposed on the first surface of the substrate and seals the electronic component. The substrate has an air vent at a position covered with the molding resin. The air vent passes through the substrate from the first surface to the second surface. The second surface of the substrate is covered with a solder resist that has an opening portion at a position corresponding to the air vent. The solder resist surrounds a periphery the air vent.

Accordingly, since the substrate has the air vent, air in a cavity of a molding die can be released through the air vent when the resin is molded. The solder resist is disposed on the second surface of the substrate and the opening portion is formed at the position of the solder resist corresponding to the air vent. Therefore, since the solder resist has a rough surface, the air can be also released from a clearance provided between the molding die and the solder resist. Further, since the solder resist has a thickness, the resin can be held in a space that is formed between the second surface of the substrate and the molding die.

As such, in the electronic device having the substrate with the air vent, the resin, which has passed through the air vent, can be restricted from flowing out and the substrate and the air vent can be restricted from losing its function due to the substrate and the molding closely contacting with each other.

In a method for manufacturing the electronic device having the structure described above, when the molding resin is formed, the air can be released through the air vent and the resin flowing out through the air vent can be dammed up by the solder resist that surrounds the air vent. Therefore, in the electronic device having the substrate with the air vent, the resin, which has passed through the air vent, can be restricted from flowing out and the air vent can be restricted from losing its function due to the substrate and the molding closely contacting with each other.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Embodiments of the present disclosure will be described hereinafter with reference to the drawings. Same or equivalent parts will be designated with the same symbols in the embodiments described hereinafter.

First Embodiment

An overall structure of an electronic device S1 according to a first embodiment of the present disclosure will be described with reference to FIG. 1 to FIG. 4. The electronic device S1 is, for example, equipped to a vehicle such as a car and employed as a device for driving devices of the vehicle.

Figure 1:
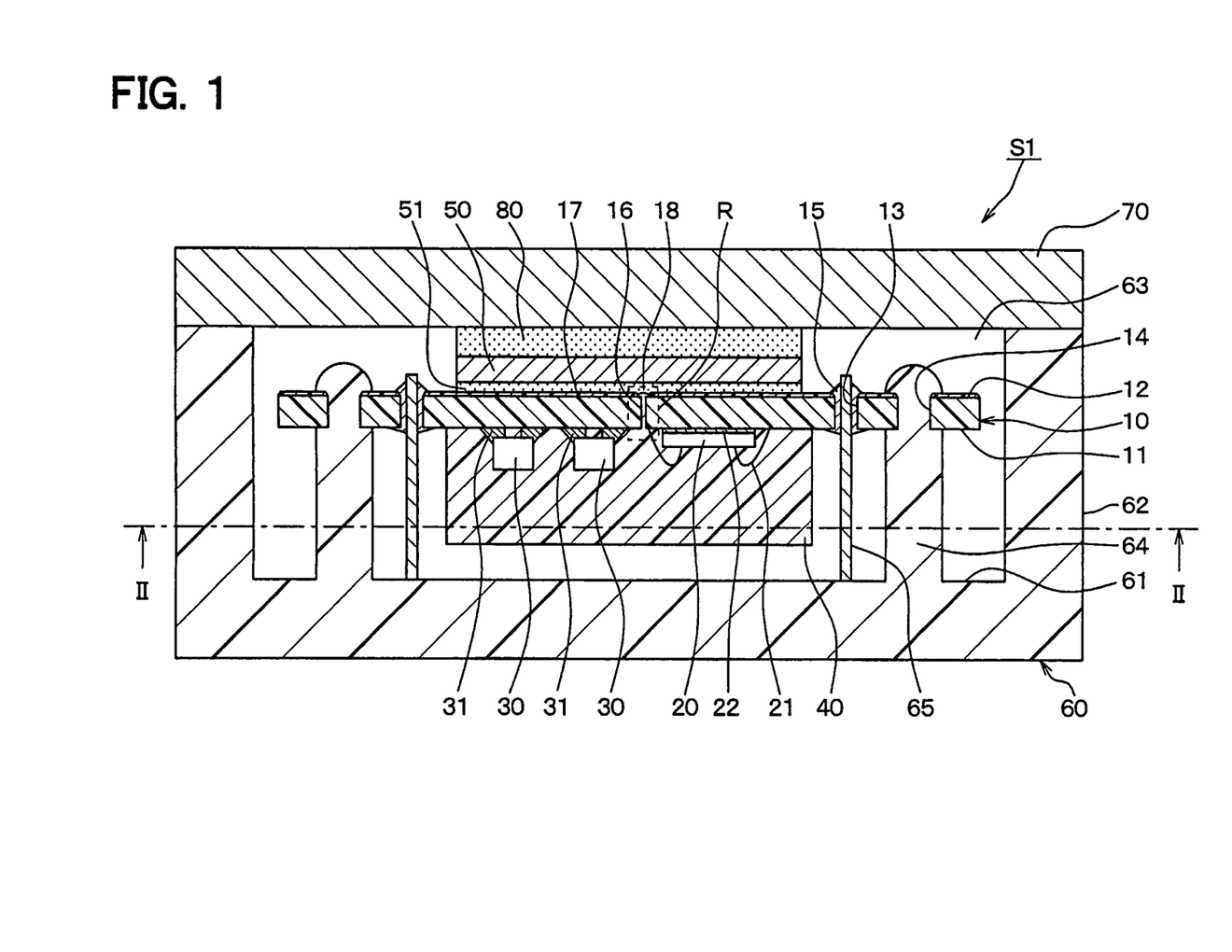
FIG. 1 is a cross-sectional view of an electronic device according to a first embodiment of the present disclosure.
Figure 2:
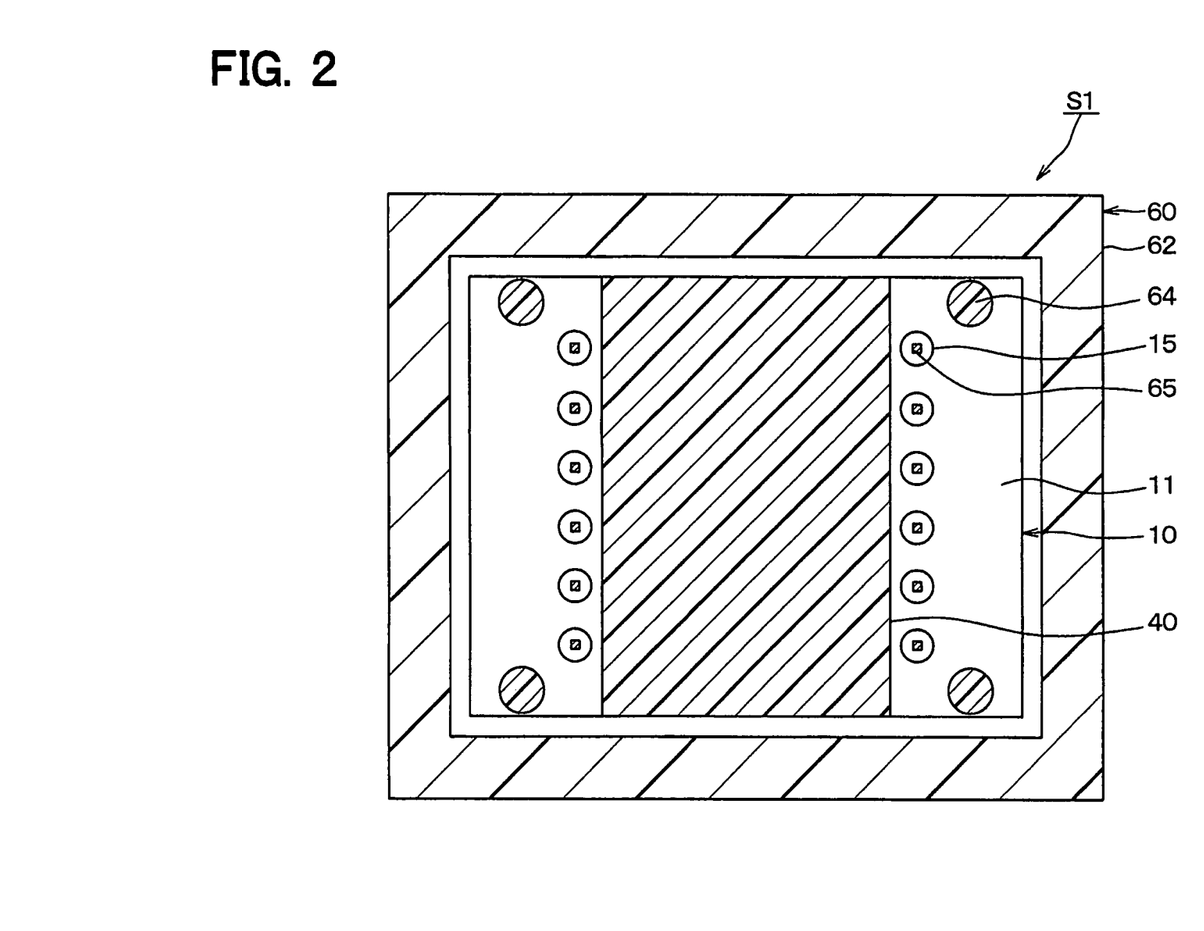
FIG. 2 is a cross-sectional view taken along a line II-II in FIG. 1.

As shown in FIG. 1 and FIG. 2, the electronic device S1 has a substrate 10, electronic components 20, 30, a molding resin 40, a heat sink 50, a case 60, a lid 70 and a heat radiating gel 80.

As shown in FIG. 1, the substrate 10 is a member having a plate shape and has a surface (first surface) 11 and the other surface (second surface) 12. The surface 11 has the electronic components 20, 30 mounted thereon and is covered with the molding resin 40. The other surface 12 is opposite to the surface 11. In the present embodiment, as shown in FIG. 2, the substrate 10 is a plate member having a rectangular shape when viewed from the top. Specifically, the substrate 10 is a wiring substrate with a resin base such as an epoxy resin and the like and examples of the wiring substrate are a through-hole-substrate and a build-up-substrate.

The substrate 10 has a wiring pattern (not illustrated) that includes an inner layer wiring, a surface layer wiring or the like. Since the wiring pattern extends to the outside of the molding resin 40, the electronic components 20, 30 can be electrically connected to the outside through the wiring pattern. The substrate 10 has through holes 13 at both ends in a longitudinal direction (horizontal direction in FIG. 1). The through holes 13 are provided with metal plating connecting to the wiring pattern. The wiring pattern can be electrically connected to the outside of the substrate 10 through the through holes 13.

The substrate 10 described above is supported by the case 60 at four corners of the substrate 10. In the present embodiment, the substrate 10 has fixing holes 14 passing through the substrate 10 at the four corners. The case 60 has mechanical connecting portions 64 that project from a bottom surface 61 of the case 60 toward the inside of the case 60. The mechanical connecting portions 64 are inserted in the fixing holes 14 and heads of the mechanical connecting portions 64 are thermally deformed to support the substrate 10 by the case 60.

Figure 3:
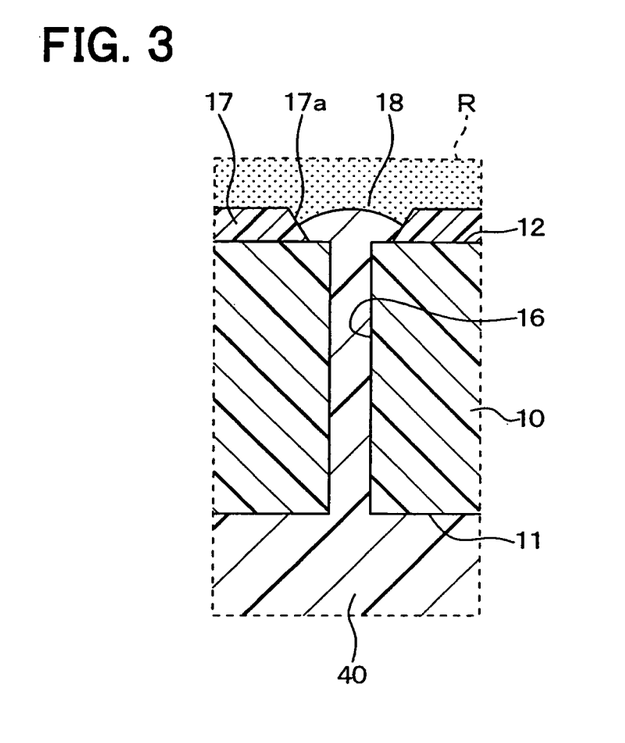
FIG. 3 is an enlarged view of a region R of FIG. 1.
Figure 4:
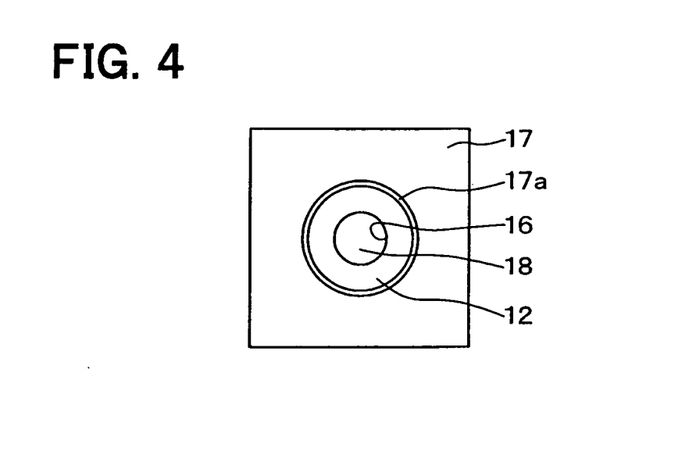
FIG. 4 is a diagram illustrating a layout of a substrate 10 in the region R of FIG. 1, when viewed from the other surface 12.

As shown in FIG. 1, FIG. 3 and FIG. 4, in the present disclosure, the substrate 10 has an air vent 16 that passes through the substrate 10 at a position covered with the molding resin 40. The air vent 16 is used as an air releasing portion when the substrate 10 is sealed with the molding resin 40. Although a section size of the air vent 16 can be chosen arbitrarily, it is preferable that the air vent 16 has a section size so that the air bent 16 does not cause a flow resistance of air but causes a flow resistance of resin. For example, it is preferable that the air vent 16 has a section size smaller than that of the through hole 13. Although a position where the air vent 16 is formed can be chosen arbitrarily, it is preferable that the air vent 16 is formed at a position where air bubbles are likely to be generated, such as a position between the electronic components 20, 30, a position right under the electronic components 20, 30 or a position adjacent to an outer periphery of the molding resin 40.

As shown in FIG. 1, FIG. 3 and FIG. 4, the other surface 12 of the substrate 10 is covered with solder resist 17. A surface of the solder resist 17 is rough so that air can be released and resin can hardly be released. The solder resist 17 has an opening portion 17a at a position corresponding to the air vent 16. The opening portion 17a entirely surrounds a periphery of the air vent 16. As shown in FIG. 3, the opening portion 17a of the solder resist 17 has an opening end that is spaced from the periphery of the air vent 16 by a predetermined distance, or has a tapered shape in which an opening diameter gradually increases as a function of distance from the other surface 12. Therefore, since the solder resist 17 has a thickness, a space 18 is provided by the opening portion 17a of the solder resist 17 around the air vent 16. The space 18 functions as a resin accumulating portion to accumulate the resin for forming the molding resin 40 having passed through the air vent 16 therein, thereby to restrict the resin from flowing out. Although the resin does not necessarily flow into the air vent 16 and the space 18, FIG. 3 illustrates a state where the resin flows into the air vent 16 and the space 18.

The electronic components 20, 30 are mounted on the substrate 10 to be electrically connected to the wiring pattern, and may be any type of components such as a surface-mount-component, a through-hole-mount-component and the like. In the present embodiment, a semiconductor element 20 and a passive element 30 are used as examples of the electronic components 20, 30. Examples of the semiconductor element 20 are power elements generating large heat such as a microcomputer, a control element, an Insulated Gate Bipolar Transistor (IGBT), a Metal Oxide Semiconductor Field Effect Transistor (MOSFET). The semiconductor element 20 is connected to a land of the substrate 10 through a bonding wire 21 and a die-bonding material 22 such as solder. The land is connected to the wiring pattern or is a part of the wiring pattern. Examples of the passive element 30 are a chip resistor, a chip capacitor and a quart resonator. The passive element 30 is connected to the land of the substrate 10 through a die-bonding material 31 such as solder. As described above, the electronic components 20, 30 are electrically connected to the wiring pattern of the substrate 10 to be electrically connected to the outside through the through holes 13 connected to the wiring pattern.

The molding resin 40 is made of a thermosetting resin such as an epoxy resin and the like. The molding resin 40 is formed by a transfer molding method or a compression molding method using a metal mold. In the present embodiment, the structure in which the surface 11 of the substrate 10 is sealed with the molding resin 40 and the other surface 12 of the substrate 10 is not sealed with the molding resin 40 and is exposed, which is so-called a half-mold structure, is used.

As shown in FIG. 2, the molding resin 40 has the upper surface with the rectangular shape. The molding resin 40 is formed in an area located inside of opposed two sides of the substrate 10, specifically, two sides of the substrate 10 perpendicular to the longitudinal direction of the substrate 10 so that the opposed two sides of the substrate are exposed from the molding resin 40. That is, both ends of the substrate 10 in the longitudinal direction protrude from the molding resin 40 and are exposed from the molding resin 40. The through holes 13 are disposed at a region of the substrate 10 that is exposed from the molding resin 40. The wiring pattern of the substrate 10 can be electrically connected to the outside through the through holes 13. Since both ends of the substrate 10 are exposed from the molding resin 40, the four corners of the substrate 10 are exposed from the molding resin 40 and the substrate 10 is supported by the case 60 at the region of the substrate 10 exposed from the molding resin 40.

The heat sink 50 is made of a metallic member having high heat conductivity such as aluminum or copper. The heat sink 50 is adhered to the other surface 12 of the substrate 10 through a joining member 51. As the joining member 51, a conductive adhesive including a metal filler, or a conductive material such as a solder material, or an insulating material such as a heat radiating gel or a heat radiating sheet is used. The heat sink 50 radiates heat that is generated by the electronic components 20, 30 and is conducted to the heat sink 50 from the other surface 12 of the substrate 10. Especially, in the case where the semiconductor element 20 is the IGBT or the MOSFET, which are heat generating elements, the semiconductor element 20 generates a large amount of heat. However, since the heat is conducted to the heat sink 50, the semiconductor element 20 and the passive element 30 can be restricted from having high temperature. In the present embodiment, the heat sink 50 is thermally connected to the lid 70 through the heat radiating gel 80. The heat conducted to the heat sink 50 from the other surface 12 of the substrate 10 is further conducted to the lid 70 through the heat radiating gel 80 and is radiated outside from the lid 70.

The case 60 is a case member with a rectangular parallelepiped shape, and accommodates the substrate 10 having the electronic components 20, 30 on the surface 11 and being sealed with the molding resin 40. In the present embodiment, the case 60 has an accommodating recessed portion 63 that is provided by the bottom surface 61 and a side wall surface 62 surrounding the bottom surface 61. The case 60 accommodates the substrate 10, which has the electronic components 20, 30 thereon and is sealed with the molding resin 40, in the accommodating recessed portion 63 in a state where the surface 11 opposes to the bottom surface 61.

The bottom surface 61 of the case 60 has the mechanical connecting portions 64 that support the substrate 10 as described above. The mechanical connecting portions 64 project from the bottom surface 61 in the perpendicular direction toward the inside of the case 60. Each of the mechanical connecting portions 64 is a stepped rod member having a section size being partially changed. Specifically, before the substrate 10 is fixed, a bottom portion of the mechanical connecting portion 64 has a section size larger than that of the fixing hole 14 of the substrate board 10 and a head portion of the mechanical connecting portion 64 has a section size equal to or slightly smaller than that of the fixing hole 14. Therefore, the head portion of the mechanical connecting portion 64 is inserted into the fixing hole 14 and the substrate 10 is held at a stepped portion between the head portion and the bottom portion of the mechanical connecting portion 64. Thereafter, the head portion of the mechanical connecting portion 64 that is inserted in the fixing hole 14 is thermally deformed. As such, a projecting portion of the mechanical connecting portion 64 that projects from the substrate 10 has a section size larger than that of the fixing hole 14. As a result, the substrate 10 is held between the projecting portion and the stepped portion and supported.

A length of the projecting portion of the mechanical connecting portion 64 in the perpendicular direction is shorter than the height of the side wall surface 62. The substrate 10 is disposed more inside of the accommodating portion 63 than a head of the side wall surface 62.

The case 60 has the bottom surface 61 with a plurality of connecting terminals 65 that protrude from the bottom surface 61 in the perpendicular direction. For example, the connecting terminals 65 are made of copper alloy plated with tin or nickel. Each of the plurality of connecting terminals 65 is inserted into the through hole 13 of the substrate 10 and electrically connected to the through hole 13 through the connecting member 15 such as solder and the like. The case 60 is made of an insulating member with a resin base such as polyphenylene sulfide (PPS), polybutylene terephthalate (PBT) and the like. The case 60 has a wiring pattern extending to the outside of the case 60. The connecting terminals 65 are connected to the wiring pattern of the case 60. The wiring pattern of the substrate 10 having the electronic components 20, 30 thereon is electrically connected to the outside through the connecting terminals 65 and the wiring pattern of the case 60.

The lid 70 is connected to an opening end of the case 60, that is, an end of the side wall surface 62 to tightly close the case 60. The lid 70 is fixed to the case 60 through, for example, an adhesive. In the present embodiment, the lid 70 is made of a metal material having a high heat conductivity such as aluminum or copper and is a member having a rectangular plate shape.

The heat radiating gel 80 is disposed between the heat sink 50 and the lid 70. The heat radiating gel 80 is in contact with both the heat sink 50 and the lid 70 and conducts heat from the heat sink 50 to the lid 70. For example, the heat radiating gel 80 is made of a silicone oil compound with a high heat conductivity. Although it is possible to use a structure where the heat sink 50 and the lid 70 are directly in contact with each other without the heat radiating gel 80, it will be difficult to adjust a height of the heat sink 50 and the heat sink 50 will be pressed while the lid 70 is fixed. Therefore, it is preferable to dispose the heat radiating gel 80, which has a deformable character.

The electronic device S1 according to the present embodiment is constructed as described above. The electronic device S1 is manufactured by the following method.

First, the substrate 10 having the wiring pattern and the through holes 13 is prepared and the electronic components 20, 30 are mounted on the surface 11 of the substrate 10. Next, the substrate 10 is sealed with the molding resin 40 by the transfer molding method or the compression molding method. After the heat sink 50 is joined to the other surface 12 of the substrate 10 through the joining member 51, the substrate 10 is disposed in the accommodating recessed portion 63 of the case 60 so that the surface 11 of the substrate 10 opposes to the bottom surface 61 of the case 60. The plurality of the connecting terminals 65 are inserted into the through holes 13 and the head portions of the mechanical connecting portions 64 are inserted in the fixing holes 14.

Thereafter, the head portions of the mechanical connecting portions 64 are thermally deformed, and the through holes 13 and the connecting terminals 65 are connected through the connecting members 15 by soldering or the like. Finally, after the heat radiating gel 80 is disposed on the surface of the heat sink 50, the lid 70 is disposed on the heat radiating gel 80 and fixed to the side wall surface 62 of the case 60 through an adhesive or the like. Thus, the electronic device S1 according to the present embodiment is produced.

In such a manufacturing method, there is a possibility that the air bubbles remain in the molding resin 40 when the electronic components 20, 30 are mounted on the surface 11 of the substrate 10 and the substrate 10 is sealed with the molding resin 40. The air vent 16 can be formed in the substrate 10 to restrict such a possibility. However, when the air vent 16 is merely formed, the metal mold will closely contact the other surface 12 of the substrate 10 to closely contact with an opening end of the air vent 16. Therefore, there will not be a portion receiving the resin. In contrast, in the present embodiment, the other surface 12 of the substrate 10 is covered with the solder resist 17, but the solder resist 17 is not provided on the periphery of the air vent 16. Therefore, the space 18 can function as the resin accumulating portion. The state will be described with reference to FIG. 5.

Figure 5:
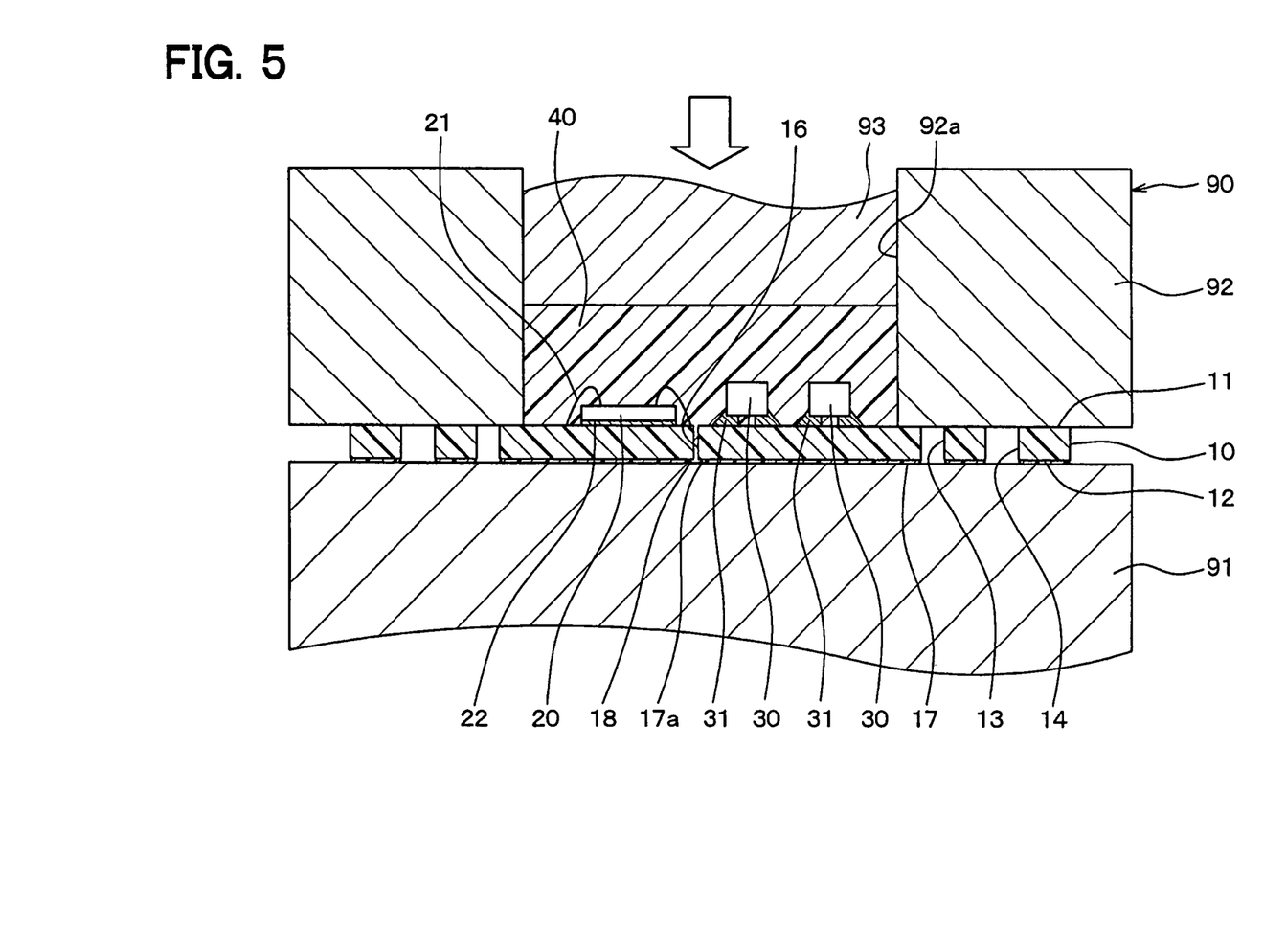
FIG. 5 is a cross-sectional view illustrating a state where a molding resin 40 is molded.

FIG. 5 illustrates a state where the substrate 10 is sealed with the molding resin 40 by, for example, the compression molding method. As shown in FIG. 5, a metal mold 90 including a lower mold (first mold) 91, an upper mold (second mold) 92 and a plunger 93 is used as a molding die. First, the substrate 10 is disposed on the lower mold 91 in a state where the other surface 12 opposes to the lower mold 91. The other surface 12 has the solder resist 17 thereon and the solder resist 17 has the opening portion 17a at the position corresponding to the air vent 16. Therefore, the space 18 is provided between the other surface 12 of the substrate 10 and the lower mold 91.

Next, the upper mold 92 is disposed, and resin powder used for the compression molding is inserted into an opening portion 92a of the upper mold 92. Thereafter, the plunger 93 is slid in the opening portion 92a to mold the resin by heating and pressurizing. As such, the molding resin 40 is formed. Since the substrate 10 has the air vent 16, air in a cavity of the metal mold 90 can be released through the air vent 16. Although the other surface 12 of the substrate 10 is covered with the solder resist 17, the surface of the solder resist 17 is rough. Therefore, the air can be released from a clearance between the lower mold 91 and the solder resist 17, the clearance resulting from the rough surface of the solder resist 17.

As a result, the air bubbles are less likely to remain in the molding resin 40. Especially, when the wiring pattern is formed on the other surface 12 of the substrate 10 and a film of the solder resist 17 is formed on the wiring pattern as an insulating material that insulates and protects the wiring pattern, the solder resist 17 is likely to have a further rough surface because a surface of the wiring pattern is also rough. Therefore, when the wiring pattern is formed on the other surface 12 of the substrate 10, the air can be released from the clearance between the lower mold 91 and the solder resist 17 more certainly.

When the resin flows out through the air vent 16, since the space 18 is provided, the solder resist 17 functions as the dam to dam up the resin in the space 18 and minimizes the resin flowing out from the clearance between the solder resist 17 and the lower mold 91.

As described above, in the present embodiment, since the substrate 10 has the air vent 16, the air in the cavity of the metal mold 90 can be released through the air vent 16 when the resin is molded. Also, the solder resist 17 is disposed on the other surface 12 of the substrate 10 and has the opening portion 17a at the position corresponding to the air vent 16. Therefore, the air can be released from the clearance between the lower mold 91 and the solder resist 17 resulting from the rough surface of the solder resist 17 and the resin can be held in the space 18 provided between the other surface 12 of the substrate 10 and the lower mold 91.

As a result, in the case where the substrate 10 has the air vent 16, the resin having passed through the air vent 16 can be restricted from flowing out, and the air vent 16 can be restricted from losing its function due to the substrate 10 and the metal mold 90 closely contacting with each other.

Especially, in the case where the wiring pattern is formed on the other surface 12 of the substrate 10 and the film of the solder resist 17 is formed on the wiring pattern to insulate and protect the wiring pattern, the solder resist 17 has a function of the insulating material, a function of the dam to dam up the resin, and a function of releasing air while restricting the substrate 10 and the metal mold 90 from closely contacting with each other.

Second Embodiment

Second embodiment of the present disclosure will be described. The present disclosure has the solder resist 17 with a different structure from the first embodiment. Since the other structures are similar to the first embodiment, parts different from the first embodiment will be described.

Figure 6:
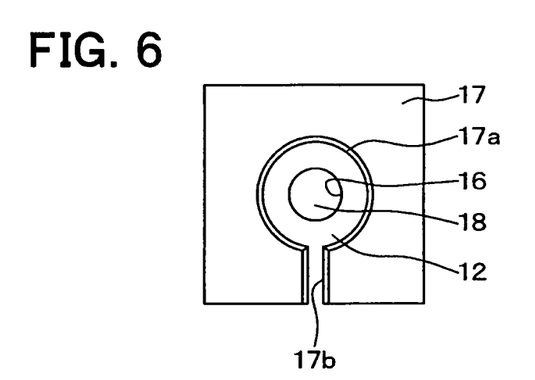
FIG. 6 is a diagram illustrating a layout of a substrate 10 in a region corresponding to the region R of FIG. 1, when viewed from the other surface 12 of an electronic device, according to a second embodiment of the present disclosure.

As shown in FIG. 6, in the present embodiment, the solder resist 17 does not entirely surround the periphery of the air vent 16. The solder resist 17 has a groove portion 17b connecting to the opening portion 17a. The solder resist 17 surrounds the air vent 16 in C-shape. The groove portion 17b is formed in a direction which does not cause any problem even if the resin flows out in the direction. For example, the groove portion 17b extends to an end of the substrate 10. The air can be released through the groove portion 17b. Therefore, when the resin is molded, the air in the cavity of the metal mold 90 can be released more certainly and the air bubbles can be restricted from remaining in the molding resin 40 more certainly.

Although a width of the groove portion 17b can be chosen arbitrarily, it is preferable that the groove portion 17b has a width so that the groove portion 17*b* does not cause a flow resistance of air but causes a flow resistance of resin. As such, even when the resin is about to flow out through the groove portion 17*b*, the flow of the resin can be stopped in the groove portion 17*b*.

Third Embodiment

Third embodiment of the present disclosure will be described. In the present disclosure, the wiring pattern formed on the other surface 12 of the substrate 10 and the solder resist 17 have different structures compared to the first embodiment. Since the other structures are similar to the first embodiment, parts different from the first embodiment will be described.

Figure 7:
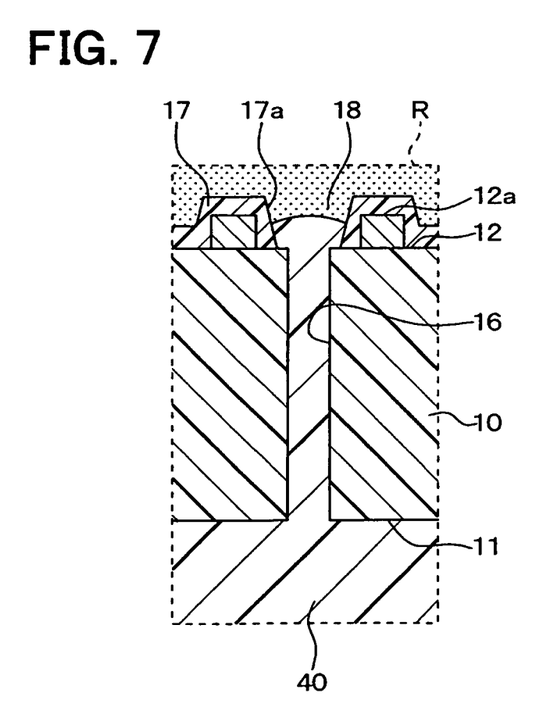
FIG. 7 is an enlarged cross-sectional view of a region corresponding to the region R of FIG. 1 of an electronic device according to a third embodiment of the present disclosure.
Figure 8:
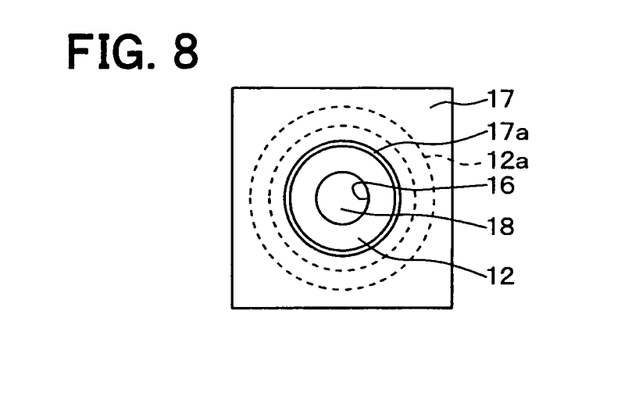
FIG. 8 is a diagram illustrating a layout of a substrate 10 in the region corresponding to the region R of FIG. 1, when viewed from the other surface 12 of an electronic device shown in FIG. 7.

As shown in FIG. 7 and FIG. 8, in the present embodiment, the air vent 16 is entirely surrounded by a conductor pattern 12*a* that is a part of the wiring pattern formed on the other surface 12 of the substrate 10. For example, the conductor pattern 12*a* is a part of a surface layer wiring that is made by laminating metallic foil or planting metal such as copper. The conductor pattern 12*a* is covered with the solder resist 17. As a result, a covering portion of the solder resist 17 that covers the conductor pattern 12*a* has a greater height from the other surface 12 of the substrate 10 to the surface of the solder resist 17 than a non-covering portion of the solder resist 17 that does not cover the conductor pattern 12*a*. As such, the height from the other surface 12 of the substrate 10 to the surface of the solder resist 17 can be increased around the air vent 16 and a capacity of the space 18 can be increased. Therefore, the amount of the resin accumulated in the space 18 can be increased and the resin can be more restricted from flowing out from the space 18.

Fourth Embodiment

Fourth embodiment of the present disclosure will be described. In the present disclosure, the conductor pattern 12*a* disposed around the air vent 16 has a layout different from the third embodiment. Since the other structures are similar to the third embodiment, parts different from the third embodiment will be described.

Figure 9:
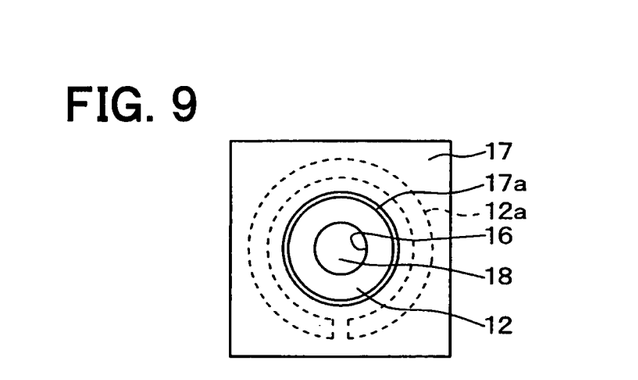
FIG. 9 is a diagram illustrating a layout of a substrate 10 in a region corresponding to the region R of FIG. 1, when viewed from the other surface 12 of an electronic device, according to a fourth embodiment of the present disclosure.

As shown in FIG. 9, in the present embodiment, the conductor pattern 12*a* of the other surface 12 of the substrate 10 does not entirely surround the periphery of the air vent 16 and the conductor pattern 12*a* surrounding the air vent 16 has a cutout at a part. Specifically, the conductor pattern 12*a* surrounding the air vent 16 has a C-shape. As a result, a portion of the solder resist 17 corresponding to the cutout of the conductor pattern 12*a* has a smaller height from the surface of the other surface 12 to the surface of the solder resist 17 than a portion of the solder resist 17 corresponding to the conductor pattern 12*a*. Hence, the cutout of the conductor pattern 12*a* provides a clearance between the lower mold 91 and the solder resist 17 when the resin is molded. Therefore, similar to the second embodiment in which the solder resist 17 has the groove portion 17*b*, the air can be released through the cutout of the conductor pattern 12*a*. When the resin is molded, the air in the cavity of the metal mold 90 can be released more certainly and the air bubbles can be restricted from remaining in the molding resin 40 more certainly.

Although a width of the cutout of the conductor pattern 12*a* can be chosen arbitrarily, it is preferable that the cutout of the conductor pattern 12*a* has a width so that the cutout does not cause a flow resistance of air but causes a flow resistance of resin. As such, even when the resin is about to flow out through the cutout of the conductor pattern 12*a*, the flow of the resin can be stopped in the cutout.

Other Embodiments

The present disclosure is not limited to the embodiments described above and can be modified suitably within the scope of claims.

For example, in the above embodiments, an example of the electronic device S1 in which the electronic components 20, 30 are mounted on the surface 11 of the substrate 10 and sealed with the molding resin 40 is described. However, the electronic device S1 may have a structure that is not described in the above embodiments. For example, although the surface 11 of the substrate 10, that is, a surface of the substrate 10 adjacent to the molding resin 40 opposes to the bottom surface 61 of the case 60 in the above embodiments, the other surface 12 of the substrate 10, that is, a surface of the substrate 10 opposite to the molding resin 40 may oppose to the bottom surface 61 of the case 60.

A method for fixing the substrate 10 with the mechanical connecting portions 64 is not limited to thermally deforming. The mechanical connecting portions 64 may be fixed to the substrate 10 by press-fitting, screwing, or fixing with screws. A method for connecting the connecting terminals 65 and the through holes 13 is not limited to soldering and may be press-fitting or the like.

Although the embodiments of the present disclosure have been described hereinabove, the present disclosure is not limited to the embodiments and the structures. Various changes and modification can be made in the present disclosure. Furthermore, various combination and formation, and other combination and formation including one, more than one or less than one element can be made in the present disclosure.

The invention claimed is:
1. An electronic device comprising:
a substrate that has a first surface and a second surface opposite to the first surface;
an electronic component that is mounted on the first surface of the substrate; and
a molding resin that is disposed on the first surface of the substrate and seals the electronic component, wherein
the substrate has an air vent at a position covered with the molding resin, the air vent passing through the substrate from the first surface to the second surface,
the second surface of the substrate is covered with a solder resist that has an opening portion at a position corresponding to the air vent, and
the solder resist surrounds a periphery of the air vent, wherein
the second surface of the substrate has a conductor pattern that entirely surrounds the periphery of the air vent,
the solder resist has a covering portion that covers the conductor pattern and a non-covering portion that does not cover the conductor pattern, and
the covering portion of the solder resist has a greater height from the second surface of the substrate than the non-covering portion.
2. An electronic device comprising:
a substrate that has a first surface and a second surface opposite to the first surface;
an electronic component that is mounted on the first surface of the substrate; and
a molding resin that is disposed on the first surface of the substrate and seals the electronic component, wherein the substrate has an air vent at a position covered with the molding resin, the air vent passing through the substrate from the first surface to the second surface, the second surface of the substrate is covered with a solder resist that has an opening portion at a position corresponding to the air vent, and the solder resist surrounds a periphery of the air vent, wherein the solder resist has a groove portion that connects to the opening portion.

3. The electronic device according to claim 1, wherein the solder resist entirely surrounds the periphery of the air vent.

4. An electronic device comprising:

a substrate that has a first surface and a second surface opposite to the first surface;

an electronic component that is mounted on the first surface of the substrate; and a molding resin that is disposed on the first surface of the substrate and seals the electronic component, wherein the substrate has an air vent at a position covered with the molding resin, the air vent passing through the substrate from the first surface to the second surface, the second surface of the substrate is covered with a solder resist that has an opening portion at a position corresponding to the air vent, and the solder resist surrounds a periphery of the air vent, wherein the second surface of the substrate has a conductor pattern that surrounds the periphery of the air vent with a cutout at a part, the solder resist has a covering portion that covers the conductor pattern and a portion corresponding to the cutout of the conductor pattern, and the covering portion of the solder resist has a greater height from the second surface of the substrate than the portion corresponding to the cutout of the conductor pattern.

5. The electronic device according to claim 4, wherein the solder resist entirely surrounds the periphery of the air vent.

\* \* \* \* \*